(12) United States Patent
Kuo

(10) Patent No.: US 8,659,068 B2
(45) Date of Patent: Feb. 25, 2014

(54) DYNAMIC MEMORY STRUCTURE

(71) Applicant: Etron Technology, Inc., Hsinchu (TW)

(72) Inventor: Ming-Hong Kuo, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/645,476

(22) Filed: Oct. 4, 2012

(65) Prior Publication Data

US 2013/0087839 A1    Apr. 11, 2013

Related U.S. Application Data

(60) Provisional application No. 61/544,288, filed on Oct. 7, 2011.

(51) Int. Cl.
*H01L 29/788* (2006.01)

(52) U.S. Cl.
USPC .......... 257/315; 257/350; 257/355; 257/401; 257/416; 438/257; 438/593

(58) Field of Classification Search
USPC ............... 257/301–302, 311–315, 350, 355, 257/410–411, 401, 416; 438/257–258, 593, 438/243–245
See application file for complete search history.

(56) References Cited

U.S. PATENT DOCUMENTS

| | | | | |
|---|---|---|---|---|
| 7,154,118 | B2* | 12/2006 | Lindert et al. | 257/66 |
| 7,193,279 | B2* | 3/2007 | Doyle et al. | 257/401 |
| 2007/0252211 | A1* | 11/2007 | Yagishita | 257/351 |
| 2007/0257301 | A1* | 11/2007 | Allibert et al. | 257/315 |
| 2010/0173460 | A1* | 7/2010 | Forbes | 438/268 |
| 2011/0012125 | A1* | 1/2011 | Nicholas et al. | 257/72 |

* cited by examiner

*Primary Examiner* — Dung A. Le

(74) *Attorney, Agent, or Firm* — Winston Hsu; Scott Margo

(57) ABSTRACT

A DRAM memory structure at least includes a strip semiconductive material disposed on a substrate and extending along a first direction, a split gate disposed on the substrate and extending along a second direction, a dielectric layer at least sandwiched between the split gate and the substrate, a gate dielectric layer at least sandwiched between the split gate and the strip semiconductive material, and a capacitor unit. The split gate independently includes a first block and a second block to divide the strip semiconductive material into a source terminal, a drain terminal and a channel. The capacitor unit is electrically connected to the source terminal.

20 Claims, 4 Drawing Sheets

DYNAMIC MEMORY STRUCTURE

CROSS REFERENCE TO RELATED APPLICATIONS

This application claims the benefit of U.S. Provisional Application Ser. No. 61/544,288, filed Oct. 7, 2011.

BACKGROUND OF THE INVENTION

1. Field of the Invention

The present invention generally relates to a dynamic memory structure. Specific words, the present invention relates to a dynamic memory structure with a split gate, a shared capacitor unit and a shared source terminal.

2. Description of the Prior Art

A dynamic random access memory (DRAM) structural unit is a memory structural unit which is formed by a metal oxide semiconductor (MOS) connected to a capacitor in series. A metal oxide semiconductor transistor includes a gate as well as at least two sets of doped regions, respectively serving as a drain or a source. A metal oxide semiconductor transistor is controlled to switch on or off by the word line which is electrically connected to the gate, and by the drain which is electrically connected to a bit line to form a current path to achieve the purposes of data storage or input through a storage node which is electrically connected to a capacitor via the source.

In the current dynamic random access memory processes, the capacitors are usually designed to be either a stacked capacitor which is stacked on the substrate surface, or a deep trench capacitor which is buried in the substrate. No matter what kind of the dynamic random access memory is involved, there is only one gate to control the switch on or off of the gate channel which is buried in the substrate, and in addition a capacitor which is electrically connected to the source is constructed to achieve the purpose of data storage or output.

With the trends toward miniaturization of electronic products, the design of the dynamic random access memory element must meet the requirements of high-integration and high density. And scale-down the size of the design of the transistor components is effective to enhance the integration of the integrated circuits such as the dynamic random access memory. When the scale-down of the size of the transistor elements hits the limits, a three-dimensional (3D) transistor, such as fin-shaped structure, is considered to be another way out.

In addition, in order to promote the dynamic random access memory devices to have good performance, the length of the channel region is usually required to be at least twice greater than the width of the channel region in three-dimensional transistors, but this is not advantageous to scale down the size of the design of the transistor elements.

In view of this, a new dynamic random access memory structure is still needed to have a smaller memory cell size, without limiting the ratio of the length to the width of the channel region, to further reduce the costs and to be more popular.

SUMMARY OF THE INVENTION

In the light of the above, the present invention proposes a novel dynamic random access memory structure which has a gate channel disposed on the substrate, a composite source terminal and capacitor, a back gate to strengthen the control over the gate channel without limiting the ratio of the length to the width of the channel region and a smaller memory unit size to further reduce the costs and to be more popular.

The DRAM memory structure of the present invention includes a substrate, a first strip semiconductor material, a split gate, a first dielectric layer, a gate dielectric layer and a first capacitor unit. The first strip semiconductor material is disposed on the substrate and extends along a first direction. The split gate is disposed on the substrate, extends along a second direction and includes an independent first block and an independent second block to divide the first strip semiconductor material into a first source terminal, a first drain terminal and a first channel region. The first dielectric layer at least partially sandwiched between the split gate and the substrate. The first gate dielectric layer is at least partially sandwiched between the split gate and the strip semiconductor material. The first capacitor unit is electrically connected to the first source terminal.

In one embodiment of the present invention, the substrate is a conductive Si substrate, an insulating Si substrate or the combination thereof.

In another embodiment of the present invention, the first direction is substantially perpendicular to the second direction, or the first direction may cross the second direction but the first direction is substantially not perpendicular to the second direction.

In another embodiment of the present invention, the first capacitor unit is disposed on the substrate and includes the first source terminal serving as a bottom electrode, a second dielectric layer at least partially covering the first source terminal to serve as a capacitor dielectric layer and a capacitor metal layer at least partially covering the second dielectric layer to serve as a top electrode.

In another embodiment of the present invention, the first dielectric layer and the second dielectric layer may be of the same high-k material and or of different high-k materials.

In another embodiment of the present invention, the second dielectric layer covers up to five sides of the first source terminal.

In another embodiment of the present invention, the capacitor metal layer may completely cover the first source terminal.

In another embodiment of the present invention, one of the first block and the second block is a drive gate and the other one is a back gate respectively to control the same gate channel.

In another embodiment of the present invention, the DRAM memory structure further includes a word line which is electrically connected to the drive gate.

In another embodiment of the present invention, the DRAM memory structure further includes a back line which is electrically connected to the back gate.

In another embodiment of the present invention, the first strip semiconductor material is higher than at least one of the first block and the second block.

In another embodiment of the present invention, at least one of the first block and the second block is higher than the first strip semiconductor material.

In another embodiment of the present invention, the split gate includes a metal.

In another embodiment of the present invention, the first strip semiconductor material, the first source terminal and the first drain terminal are integrally formed.

In another embodiment of the present invention, the DRAM memory structure further includes a bit line which is electrically connected to the first drain terminal.

In another embodiment of the present invention, the DRAM memory structure further includes a second strip semiconductor material, a second dielectric layer and a second capacitor unit. The second strip semiconductor material is disposed on the substrate and extends along the first direction. The second dielectric layer is at least partially sandwiched between the split gate and the second strip semiconductor material. The split gate further includes a third block so that the second block and the third block together divides the second strip semiconductor material into a second source terminal, a second drain terminal and a second channel region. The second capacitor unit is electrically connected to the second source terminal.

In another embodiment of the present invention, the second capacitor unit is disposed on the substrate and includes the second source terminal serving as a bottom electrode. The second dielectric layer is at least partially covering the second source terminal to serve as a second capacitor dielectric layer. The capacitor metal layer is at least partially covering the second dielectric layer to serve as a second top electrode. The first source terminal is not in contact with the second source terminal.

In another embodiment of the present invention, the first strip semiconductor material, the second strip semiconductor material, the split gate, the first capacitor unit and the second capacitor unit together form a dynamic memory unit.

In another embodiment of the present invention, the first capacitor unit and the second capacitor unit together share the capacitor metal layer.

In another embodiment of the present invention, the first capacitor unit and the second capacitor unit together share the back gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
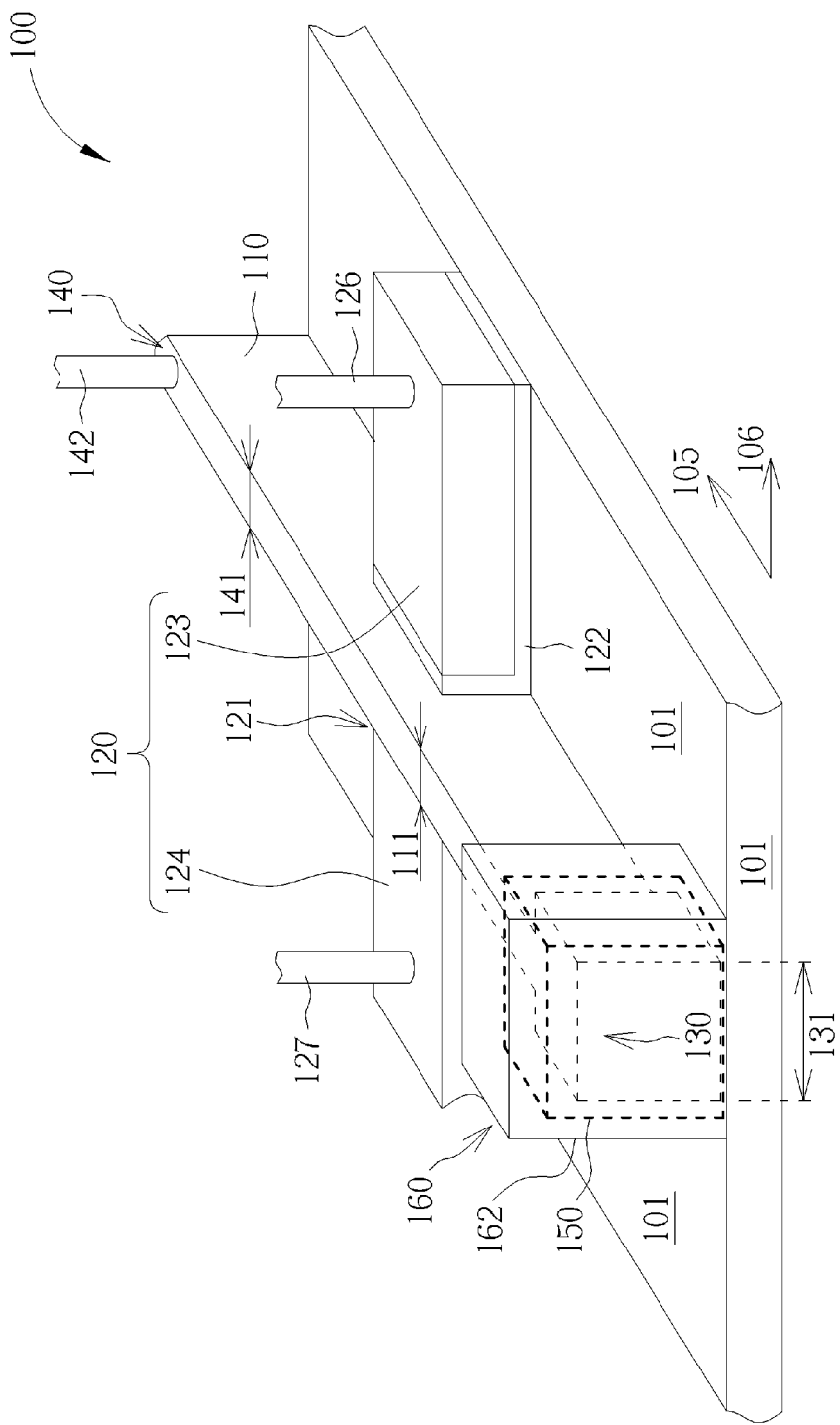
FIG. 1 and FIG. 2 illustrate a dynamic memory structure of the present invention.
Figure 2:
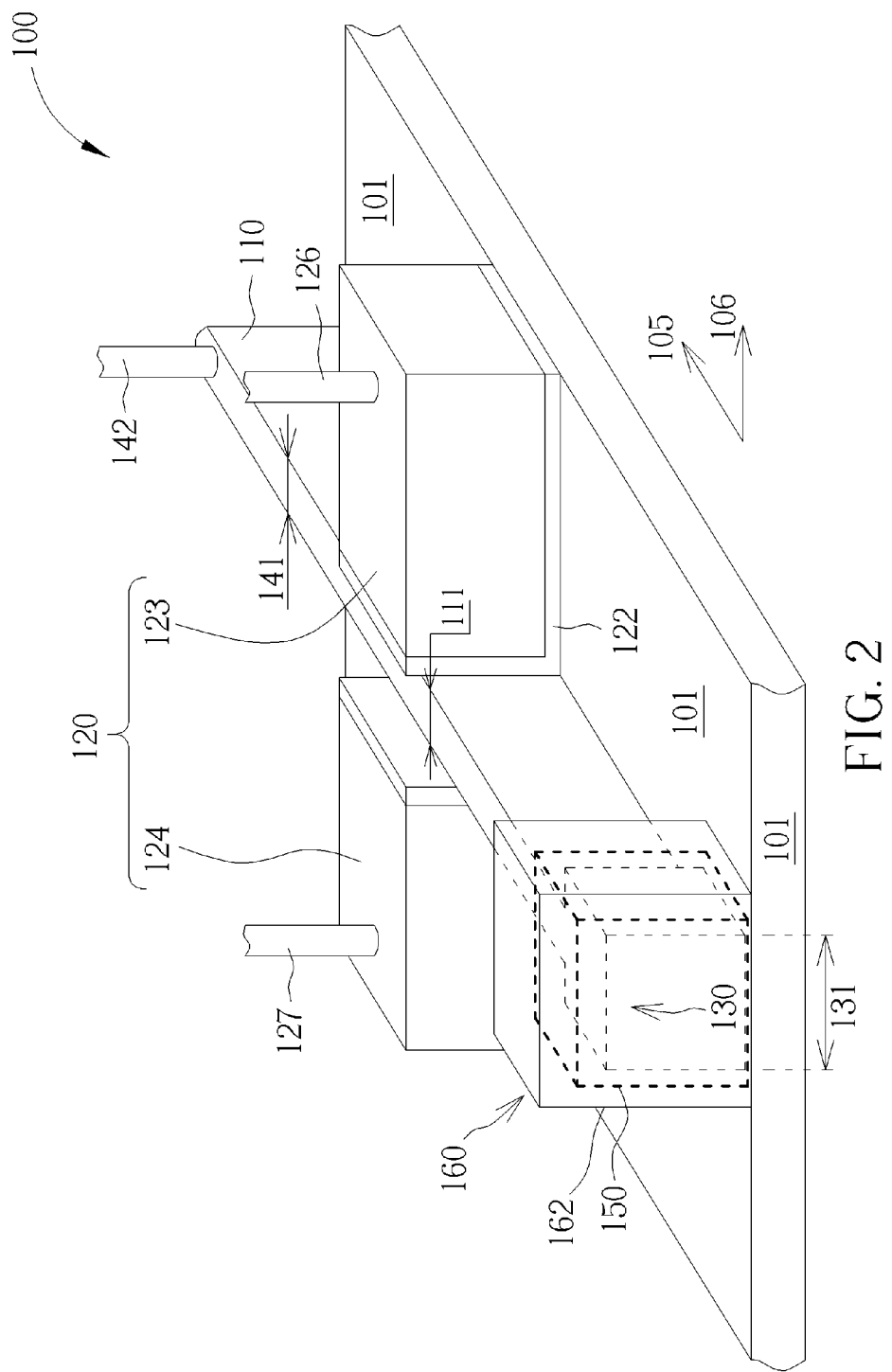

The present invention provides a dynamic memory structure with a split gate which is able to more effectively enhance the control over the gate channel and over the leakage current, as well as to realize an even smaller size of the memory unit. FIG. 1 and FIG. 2 illustrate a dynamic memory structure of the present invention. In a first embodiment of the dynamic memory structure 100 of the present invention, the dynamic memory structure 100 includes at least a substrate 101, a first strip semiconductor material 110, a gate 120, a first source terminal 130, a first drain terminal 140, a first channel region 121, a first gate dielectric layer 122, a second dielectric layer 150, and a first capacitor unit 160. The split gate 120, the first source terminal 130, the first drain terminal 140, the first channel region 121 and the first capacitor unit 160 together form the primary parts of the dynamic memory structure 100.

The substrate 101 may be a conductive Si substrate such as a Si-containing substrate, a semiconductor substrate such as a III-V group on silicon (GaN-on-silicon for instance), a graphene-on-silicon or a silicon-on-insulator (SOI), an insulating silicon substrate, or a combination thereof.

The first strip semiconductor material 110 is at least partially disposed above the substrate 101 and extends along a first direction 105. Besides, an insulating material such as a shallow trench isolation (STI) is at least disposed nearby to surround the first strip semiconductor material 110 or between each first strip semiconductor material 110. The first strip semiconductor material 110 may include Si material, such as single crystal Si, and be obtained by etching or epitaxial. Because the substrate 101 may be a conductive Si substrate or a silicon-on-insulator substrate, the first strip semiconductor material 110 may be electrically connected to the substrate 101 or electrically insulated from the substrate 101. In FIG. 1 of the first example, the substrate 101 is a bulk of Si substrate so the first strip semiconductor material 110 is electrically connected to the substrate 101.

On the other hand, the split gate 120 is disposed on the substrate 101 and extends along the second direction 106. As shown in FIG. 1, the split gate 120 includes at least an independent first block 123 and an independent second block 124. Due to the first block 123 and the second block 124, the first strip semiconductor material 110 is divided into a first source terminal 130, a first drain terminal 140 and a first channel region 121. In one embodiment of the present invention, the first strip semiconductor material 110, the first source terminal 130 and the first drain terminal 140 are integrally formed. Further, the first source terminal 130 may be electrically connected to first capacitor unit 160. In another embodiment of the present invention, the first direction 105 may be substantially perpendicular to the second direction 106. Or alternatively, the first direction 105 crosses the second direction 106 but the first direction 105 is substantially not perpendicular to the second direction 106.

A first gate dielectric layer 122 is at least partially sandwiched between the split gate 120 and the first strip semiconductor material 110, to become a gate dielectric layer of the split gate 120 to control the first channel region 121. The first gate dielectric layer 122 may also be at least partially sandwiched between the substrate 101 and the first strip semiconductor material 110 to become a first dielectric layer. Preferably, the first gate dielectric layer 122 may be a high k material with a dielectric constant larger than that of silicon oxide, such as hafnium oxide, ($HfO_2$), hafnium silicon oxide, ($HfSiO_4$), hafnium silicon oxynitride, ($HfSiON$), aluminum oxide, ($Al_2O_3$), lanthanum oxide, ($La_2O_3$), tantalum oxide, ($Ta_2O_5$) or the combination thereof.

The split gate 120 of the present invention may include a conductive material such as poly-Si, silicide or a metal, and forms a gate structure together with the first gate dielectric layer 122. In one preferred embodiment of the present invention, one of the first block 123 and the second block 124 of the split gate 120 is a drive gate while the other is a back gate, to respectively control the same gate channel 121, so they together have excellent capability to control the "on/off" state of the first channel region 121.

The drive gate and the back drive are provided with a positive voltage when the channel is "on" so the sufficient current of the "on" state of the first channel region 121 provides correct storage signals. The back drive is provided with a negative voltage when the channel is "off" to compensate the insufficiency of the drive gate to minimize the leakage current as well as to provide longer retention time. On the other hand, in order to promote the three-dimensional transistor device to have a better performance, the prior art often designs the length of the channel region at least twice larger than the width of the channel region. This is the drawback of the prior art and the present invention can avoid this restriction.

In one embodiment of the present invention, as shown in FIG. 1, the first strip semiconductor material 110 may be higher than at least one of the first block 123 and the second block 124. Or alternatively, as shown in FIG. 2, at least one of the first block 123 and the second block 124 is higher than the first strip semiconductor material 110.

In another embodiment of the present invention, the dimension of the first source terminal 130 may be larger than both the dimensions of the first drain terminal 140 and of the first channel region 121 so the first source terminal 130 and the first drain terminal 140 may have relatively asymmetric shapes. For example, the source width 131 of the first source terminal 130 along the second direction 106 is larger than the first channel region width 111 of the first strip semiconductor material 110 along the second direction 106, and larger than the drain width 141 of the first drain terminal 140 along the second direction 106 as well. As a result, the first source terminal 130, the first drain terminal 140 and the first channel region 121 together form a T shape and the first source terminal 130 is the larger terminal in dimension.

Therefore, the first capacitor unit 160 of the 3-dimensional dynamic memory structure 100 of the present invention is disposed on the surface of the substrate 101 together with the first source terminal 130, and the first source terminal 130 becomes part of the first capacitor unit 160. For example, the first capacitor unit 160 may include the first source terminal 130, a second dielectric layer 150 as well as a capacitor metal layer 162 so that first capacitor unit 160 may has a capacitance of at least 5 pF.

First, the first source terminal 130 may serve as the bottom electrode of the first capacitor unit 160. Second, the second dielectric layer 150 at least partially covers the first source terminal 130 to serve as the capacitor dielectric layer of the first capacitor unit 160. For example, the second dielectric layer 150 covers at least one side of the first source terminal 130, or the second dielectric layer 150 covers two sides, three sides, four sides or up to five sides of the first source terminal 130. Third, the capacitor metal layer 162 at least partially covers the second dielectric layer 150 to serve as a top electrode of the first capacitor unit 160. Preferably, the second dielectric layer 150 may also has a high k material with a dielectric constant larger than that of silicon oxide.

For example, the capacitor metal layer 162 may completely cover the second dielectric layer 150 and the first source terminal 130. In another embodiment of the present invention, both the first dielectric layer 122 and the second dielectric layer 150 may be of the same high k material, preferably made in the same high k material process. Taking the gate-last for high-K last process for example, the first gate dielectric layer 122 and the split gate 120 may be fabricated along with the capacitor metal layer 162 and the second dielectric layer 150 at the same stage. Or alternatively, the first gate dielectric layer 122 and the second dielectric layer 150 may be of different high k materials.

In another embodiment of the present invention, the dynamic memory structure 100 may further include a bit line, a word line and a back drive line to respectively electrically connect other components in the dynamic memory structure 100. For example, the bit line 142 is electrically connected to the first drain terminal 140 for use in reading and writing of signals, and the word line 126 is electrically connected to the drive gate 123 in the split gate 120. In still another embodiment of the present invention, the dynamic memory structure 100 may further include a back drive line 127 electrically connected to the back gate 124, to reduce the leak current as much as possible and to provide longer retention time. The operational procedures of the dynamic memory structure 100 are well known to persons of ordinary skills in the art so the details will not be elaborated.

Figure 3:
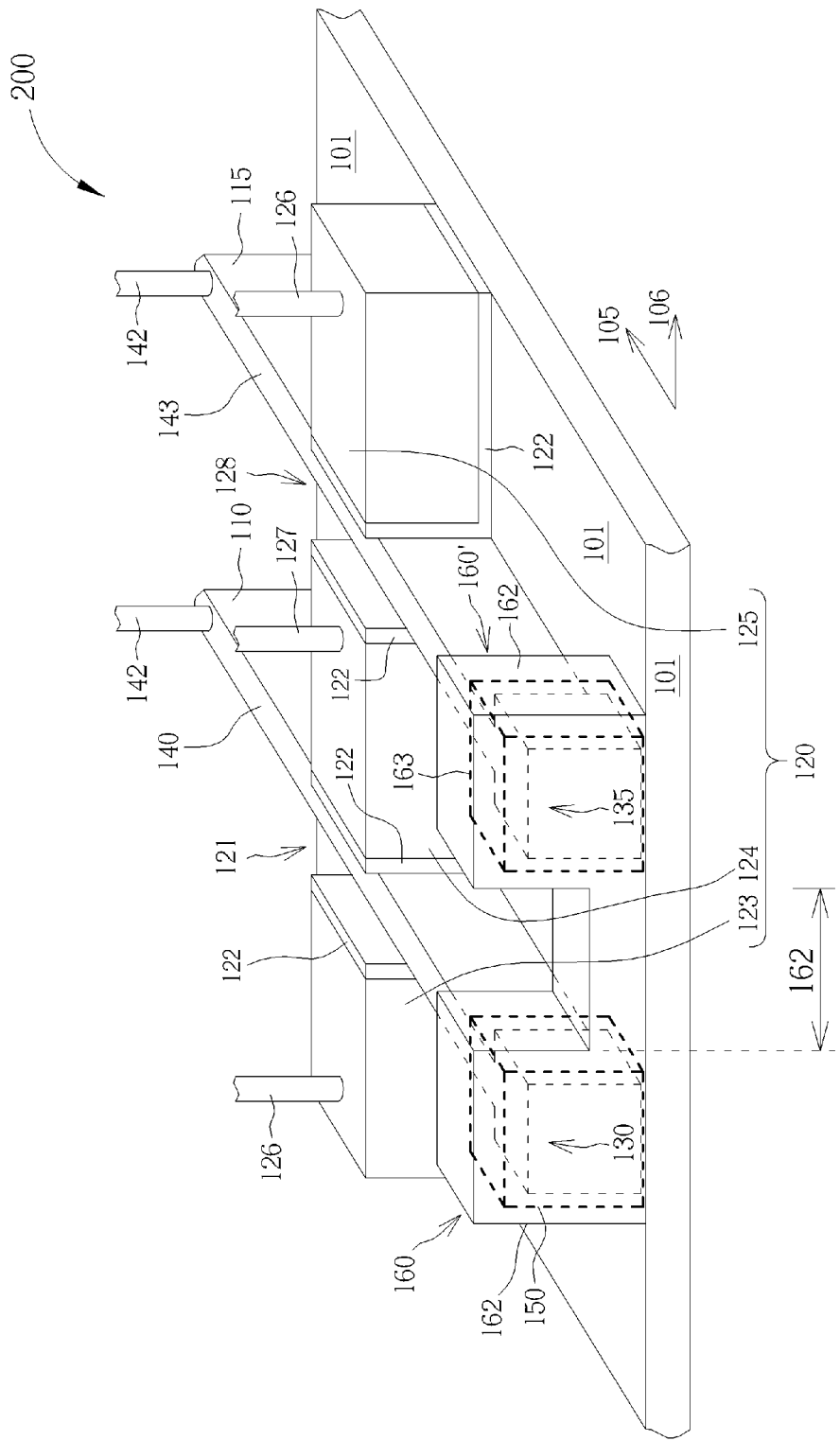
FIG. 3 illustrates that multiple strip semiconductor materials and split gates together form a dynamic memory unit.

In a second example of the present invention as shown in FIG. 3, multiple strip semiconductor materials and split gates may together form a dynamic memory unit to dramatically increase the channel width as well as the capacitor area. For example, please refer to FIG. 3, the first strip semiconductor material 110, the split gate 120 and the first capacitor unit 160 as well as the second strip semiconductor material 115 and the second capacitor unit 160' together construct another dynamic memory structure 200. The primary distinctions between this example and the above examples of the present invention reside in the number of the strip semiconductor materials, the shapes of the drain and the shapes of the capacitor metal layer.

In the second example of the present invention, first, the second strip semiconductor material 115 which is similar to the above described first strip semiconductor material 110, they both are disposed on the substrate 101 and extend along the first direction 105. The first strip semiconductor material 110 and the second strip semiconductor material 115 may be respectively electrically connected to the substrate 101 or electrically insulated from the substrate 101. The split gate 120 may further include a third block 125 so that the second block 124 and the third block 125 together divide the second strip semiconductor material 115 into a second source terminal 135, a second drain terminal 143 and a second channel region 128. The split gate 120 also divides the first strip semiconductor material 110 into the first source terminal 130, the first drain terminal 140 and the first channel region 121. At the same time, the first gate dielectric layer 122 is at least partially sandwiched between the split gate 120 and the first strip semiconductor material 110, as well as sandwiched between the split gate 120 and the second strip semiconductor material 115.

The first source terminal 130 which is disposed on the substrate 101 may serve as the bottom electrode of the first capacitor unit 160. Second, the second dielectric layer 150 at least partially covers the first source terminal 130 to serve as the capacitor dielectric layer of the first capacitor unit 160. In addition, the capacitor metal layer 162 at least partially covers the second dielectric layer 150 to serve as a top electrode of the first capacitor unit 160.

Similarly, the second capacitor unit 160' may include a second source terminal 135, a second dielectric layer 163 as well as the capacitor metal layer 162. The second source terminal 135 which is disposed on the substrate 101 may serve as the bottom electrode of the second capacitor unit 160' so the second source terminal 135 is electrically connected to the second capacitor unit 160'. The second dielectric layer 163 at least partially covers the second source terminal 135 to serve as the capacitor dielectric layer of the second capacitor unit 160'. In addition, the first capacitor unit 160 and the second capacitor unit 160' together share the capacitor metal layer 162 so that the capacitor metal layer 162 also at least partially covers the second dielectric layer 163 to serve as a top electrode of the second capacitor unit 160'.

In one embodiment of the present invention, the first source terminal 130 is not in contact with the second source terminal 135. In another embodiment of the present invention, the first strip semiconductor material 110, the second strip semiconductor material 115, the split gate 120, the first capacitor unit 160 and the second capacitor unit 160' together become a composite dynamic memory unit because the first capacitor unit 160 and the second capacitor unit 160' together share the capacitor metal layer 162. In another embodiment of the present invention, the first capacitor unit 160 and the second capacitor unit 160' may together share the back gate 124 so that the back gate 124 may respectively helps and enhances the drive gate 123 (electrically connected to the word line 126) and the drive gate 125 (electrically connected to the word line 126 as well) to control the "on" and "off" states of the first channel region 121 and the second channel region 128.

Figure 4:
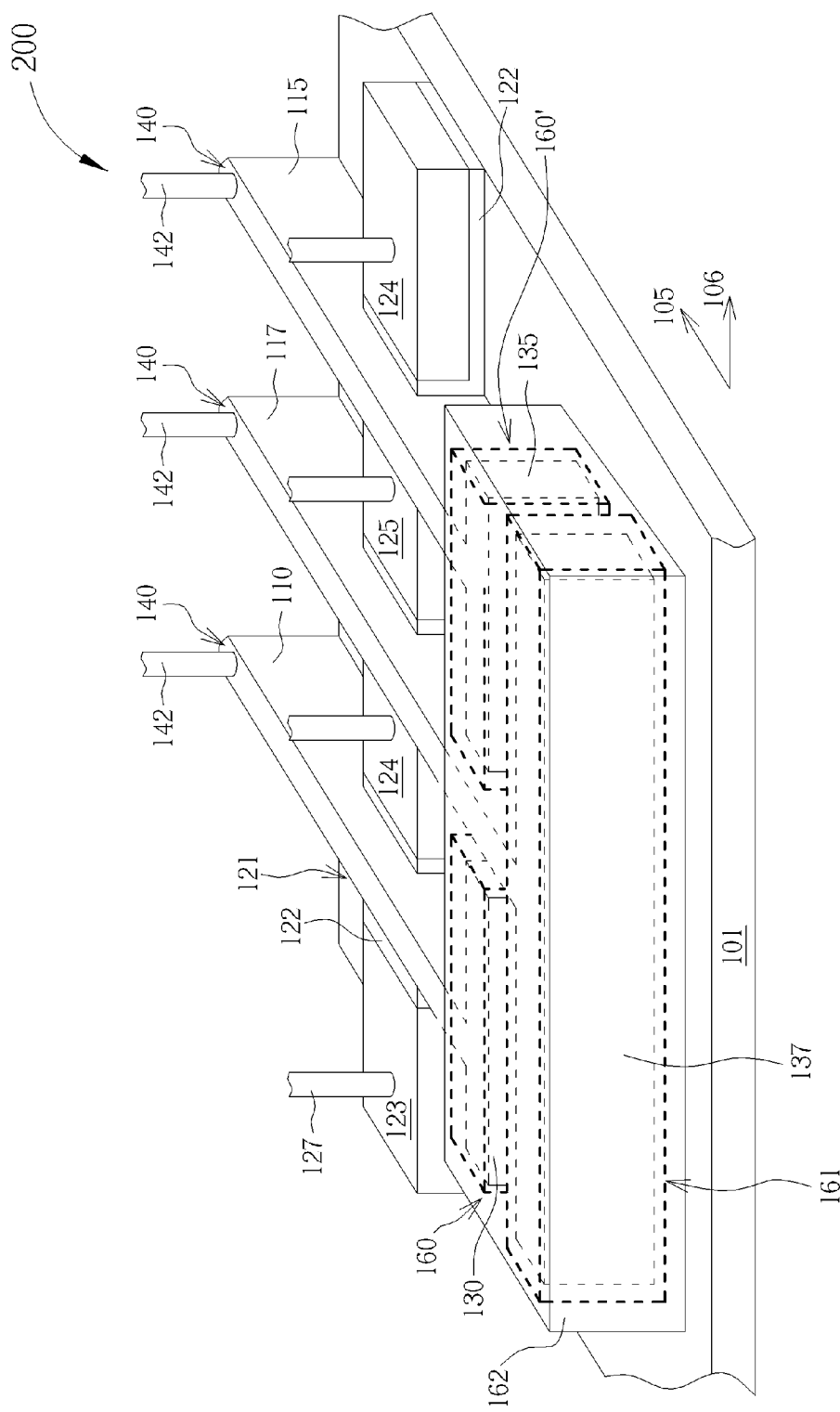
FIG. 4 illustrates that three or more split gates and strip semiconductor materials together form a dynamic memory unit.

In an embodiment of the third example of the present invention as shown in FIG. 4, three or more split gates and strip semiconductor materials may together form a dynamic memory unit to dramatically increase the channel width as well as the capacitor area. Three or more strip semiconductor materials 110/115/117 together form a dynamic memory unit. The first source terminal 130, the second source terminal 135 and the third source terminal 137 respectively serve as the bottom electrode of the first capacitor unit 160, of the second capacitor unit 160' and of the third capacitor unit 161. The capacitor metal layer 162 also at least partially covers the first capacitor unit 160, the second capacitor unit 160' and the third capacitor unit 161 to serve as a top electrode of the first capacitor unit 160, of the second capacitor unit 160' and of the third capacitor unit 161.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM memory structure, comprising:
a substrate;
a first strip semiconductor material disposed on said substrate and extending along a first direction;
a split gate disposed on said substrate, extending along a second direction and comprising independently a first block and a second block to divide said first strip semiconductor material into a first source terminal, a first drain terminal and a first channel region;
a first dielectric layer at least partially sandwiched between said split gate and said substrate;
a first gate dielectric layer at least partially sandwiched between said split gate and said strip semiconductor material; and
a first capacitor unit electrically connected to said first source terminal, wherein said first capacitor unit is disposed on said substrate and comprises said first source terminal serving as a bottom electrode, a second dielectric layer at least partially covering said first source terminal to serve as a capacitor dielectric layer, and a capacitor metal layer at least partially covering said second dielectric layer to serve as a top electrode.

2. The DRAM memory structure of claim 1, wherein said substrate is a conductive Si substrate, an insulating Si substrate or the combination thereof.

3. The DRAM memory structure of claim 1, wherein said first direction is substantially perpendicular to said second direction.

4. The DRAM memory structure of claim 1, wherein said first direction crosses said second direction but said first direction is substantially not perpendicular to said second direction.

5. The DRAM memory structure of claim 1, wherein said first dielectric layer and said second dielectric layer has one of a same high-k material and different high-k materials.

6. The DRAM memory structure of claim 1, wherein said second dielectric layer covers up to five sides of said first source terminal.

7. The DRAM memory structure of claim 1, wherein said capacitor metal layer completely covers said first source terminal.

8. The DRAM memory structure of claim 1, wherein one of said first block and said second block is a drive gate and the other one is a back gate.

9. The DRAM memory structure of claim 8, further comprising:
a word line electrically connected to said drive gate.

10. The DRAM memory structure of claim 8, further comprising:
a back line electrically connected to said back gate.

11. The DRAM memory structure of claim 1, wherein said first strip semiconductor material is higher than at least one of said first block and said second block.

12. The DRAM memory structure of claim 1, wherein at least one of said first block and said second block is higher than said first strip semiconductor material.

13. The DRAM memory structure of claim 1, wherein said split gate comprises a metal.

14. The DRAM memory structure of claim 1, wherein said first strip semiconductor material, said first source terminal and said first drain terminal are integrally formed.

15. The DRAM memory structure of claim 1, further comprising:
a bit line electrically connected to said first drain terminal.

16. The DRAM memory structure of claim 1, further comprising:
a second strip semiconductor material disposed on said substrate and extending along said first direction, wherein said split gate further comprises a third block so that said second block and said third block together divide said second strip semiconductor material into a second source terminal, a second drain terminal and a second channel region;
a second gate dielectric layer at least partially sandwiched between said split gate and said second strip semiconductor material; and
a second capacitor unit electrically connected to said second source terminal.

17. The DRAM memory structure of claim 16, wherein said second capacitor unit is disposed on said substrate and comprises said second source terminal serving as a bottom electrode, a second dielectric layer at least partially covering said second source terminal to serve as a second capacitor dielectric layer, and a capacitor metal layer at least partially covering said second dielectric layer to serve as a second top electrode, wherein said first source terminal is not in contact with said second source terminal.

18. The DRAM memory structure of claim 16, wherein said first strip semiconductor material, said second strip semiconductor material, said split gate, said first capacitor unit and said second capacitor unit together form a dynamic memory unit.

19. The DRAM memory structure of claim 18, wherein said first capacitor unit and said second capacitor unit together share a capacitor metal layer.

20. The DRAM memory structure of claim 18, wherein said first capacitor unit and said second capacitor unit together share a back gate.

* * * * *